(12) United States Patent
David et al.

(10) Patent No.: US 10,777,924 B1
(45) Date of Patent: Sep. 15, 2020

(54) CONNECTOR RECEPTACLE

(71) Applicant: Dell Products L.P., Round Rock, TX (US)

(72) Inventors: Michael David, Austin, TX (US); Ernesto Ramirez, Austin, TX (US)

(73) Assignee: Dell Products L.P., Round Rock, TX (US)

(*) Notice: Subject to any disclaimer, the term of this patent is extended or adjusted under 35 U.S.C. 154(b) by 15 days.

(21) Appl. No.: 16/292,439

(22) Filed: Mar. 5, 2019

(51) Int. Cl.
| | | |
|---|---|---|
| *H05K 7/00* | (2006.01) | |
| *H01R 12/72* | (2011.01) | |
| *H05K 7/14* | (2006.01) | |
| *H05K 1/18* | (2006.01) | |
| *H01R 12/70* | (2011.01) | |

(52) U.S. Cl.
CPC ......... *H01R 12/721* (2013.01); *H01R 12/707* (2013.01); *H05K 1/181* (2013.01); *H05K 7/14* (2013.01)

(58) Field of Classification Search
CPC .... H01R 12/721; H01R 12/707; H05K 1/181; H05K 7/14
See application file for complete search history.

(56) References Cited

U.S. PATENT DOCUMENTS

| | | | | |
|---|---|---|---|---|
| 5,224,866 A | * | 7/1993 | Nakamura | H01R 12/716 439/346 |
| 5,525,072 A | * | 6/1996 | Kunishi | H01R 12/57 439/495 |
| 5,641,314 A | * | 6/1997 | Broschard, III | H01R 13/428 439/733.1 |
| 6,210,209 B1 | * | 4/2001 | Wu | H01R 12/79 439/495 |
| 7,273,390 B2 | * | 9/2007 | Iida | H01R 43/16 439/357 |
| 7,789,678 B2 | * | 9/2010 | Nagata | H01R 12/716 439/108 |
| 9,287,641 B2 | * | 3/2016 | Kato | H01R 12/79 |
| 2008/0242139 A1 | * | 10/2008 | Matsuoka | H01R 12/79 439/357 |

(Continued)

OTHER PUBLICATIONS

"DF37 Series—0.4mm Pitch, 0.98/1.5mm Mated Height, Board-to-Board/Board-to-FPC Connectors." Hirose Electric Co., Ltd., Dec. 1, 2018; 13 pages.

*Primary Examiner* — Yuriy Semenenko
(74) *Attorney, Agent, or Firm* — Baker Botts L.L.P.

(57) ABSTRACT

In one or more embodiments, a receptacle connector may include multiple springs that are configured to hold a plug connector to the receptacle connector when the plug connector is mated with the receptacle connector; a terminal; and multiple conductors disposed on the terminal in parallel side-by-side spaced apart relationship, each conductor of the multiple conductors disposed on the terminal includes a U-shaped section to give the conductor a spring property in a direction orthogonal to a longitudinal axis of the receptacle connector to contact a respective conductor of multiple conductors of the plug connector and includes a section that is configured to be soldered to a printed circuit board. In one or more embodiments, the receptacle connector may be configured to mate with the plug connector in a first position and a second position rotated one hundred and eighty degrees from the first position.

20 Claims, 8 Drawing Sheets

(56) References Cited

U.S. PATENT DOCUMENTS

| | | | |
|---|---|---|---|
| 2009/0227138 A1* | 9/2009 | Lv | H01R 12/716 439/466 |
| 2014/0308825 A1* | 10/2014 | Hashiguchi | H01R 13/24 439/66 |
| 2014/0329415 A1* | 11/2014 | Liao | H01R 12/598 439/660 |
| 2018/0248287 A1* | 8/2018 | Ashibu | H01R 12/716 |

* cited by examiner

CONNECTOR RECEPTACLE

BACKGROUND

Field of the Disclosure

This disclosure relates generally to connectors utilized with information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, a receptacle connector may include multiple springs that are configured to hold a plug connector to the receptacle connector when the plug connector is mated with the receptacle connector; a terminal; and multiple conductors disposed on the terminal in parallel side-by-side spaced apart relationship, each conductor of the multiple conductors disposed on the terminal includes a U-shaped section to give the conductor a spring property in a direction orthogonal to a longitudinal axis of the receptacle connector to contact a respective conductor of multiple conductors of the plug connector and includes a section that is configured to be soldered to a printed circuit board (PCB). In one or more embodiments, the receptacle connector may be configured to mate with the plug connector in a first position and a second position rotated one hundred and eighty degrees from the first position.

In one or more embodiments, the multiple springs may be configured to be coupled to a ground conductor of the PCB. In one or more embodiments, each conductor of the multiple conductors disposed on the terminal may include a second U-shaped section, different from the first U-shaped section, to give the conductor the spring property in the direction orthogonal to the longitudinal axis of the receptacle connector to contact the respective conductor of the multiple conductors of the plug connector. In one or more embodiments, each conductor of the multiple conductors may include an angled section, different from the section to give the conductor the spring property, that permits the conductor to contact the respective conductor of the plurality of conductors of the plug connector. In one example, the angled section may include an angle greater than or equal to forty-five degrees to one hundred and thirty-five degrees. In another example, the angled section may include an angle less than or equal to one hundred and thirty-five degrees. In one or more embodiments, each spring of the multiple springs may include a P-section to hold the plug connector to the receptacle connector. In one or more embodiments, the multiple springs are disposed on either side of the multiple conductors disposed on the terminal.

In one or more embodiments, an information handling system may include a first display, at least one processor, and a memory medium coupled to the at least one processor. For example, the memory medium may be configured to store instructions executable by the at least one processor. In one or more embodiments, the information handling system may further include a first PCB coupled to the at least one processor and coupled to the first display. For example, the first printed circuit board has a first receptacle connector mounted to the first PCB.

In one or more embodiments, the first PCB may have at least one integrated circuit mounted to the first PCB. In one or more embodiments, the first PCB may be coupled to the first display and may be configured to: receive, from the at least one processor, first video information via the first receptacle connector and provide the first video information to the at least one integrated circuit of the first PCB. For example, the at least one integrated circuit of the first PCB may be configured to provide the first video information to the first display. In one or more embodiments, the information handling system may further include a cable assembly that includes the plug connector. For example, the cable assembly may be configured to receive the first video information and provide the video information to the first receptacle connector.

In one or more embodiments, the information handling system may further include a second display and a second PCB coupled to the at least one processor and coupled to the second display. For example, the second PCB may have a second receptacle connector mounted to the second PCB. For instance, the second receptacle connector may be configured to mate with a second plug connector that is not rotated or is rotated by one hundred and eighty degrees.

In one or more embodiments, the second PCB may have at least one integrated circuit mounted to the second PCB. For example, the second PCB may be configured to receive, from the at least one processor, second video information via the second receptacle connector and provide the second video information to the at least one integrated circuit of the second PCB. In one or more embodiments, the second PCB may be further configured to provide the second video information to the second display. In one or more embodiments, the second display may be configured to be at a range of angles with respect to the first display. For example, an information handling system may be configured to include the first display and the second display. For instance, the information handling system may be configured to have the second display to be at a range of angles with respect to the first display.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
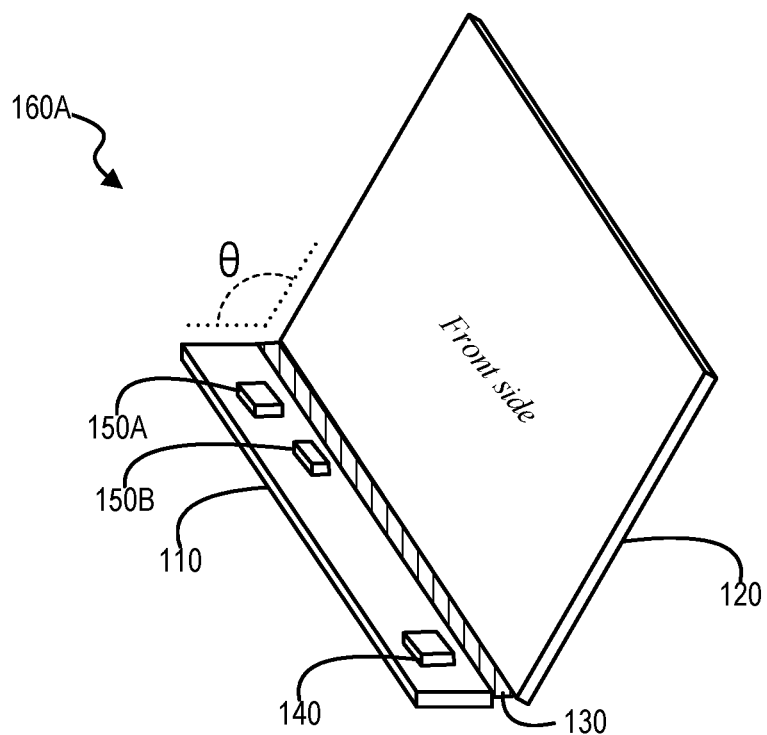
FIGS. 1A and 1B illustrate an example of a printed circuit board coupled to a display, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a configuration of a display printed circuit board (PCB) may contribute to a form factor area of differentiation and identification (ID). For example, a flat panel display configuration may allow for a thinner hinge up that may contribute to a flatter appearance. In one or more embodiments, a bent display panel configuration may allow for a smaller x-axis and/or a y-axis that may contribute to a wedged appearance. In one example, a customer preference may influence a tradeoff for each line of balance (LOB). In another example, an other tradeoff may be that if one LOB is with a flat style display panel while another is with a bent style panel, the ability to leverage the panel may not be attainable.

In one or more embodiments, one or more plug connectors and/or one or more receptacle connectors may permit utilizing multiple styles of display panels. In one example, the multiple styles of display panels may be produced via a single manufacturing line. In another example, a single receptacle connector utilized with the multiple styles of display panels may reduce a complexity of differing parts.

In one or more embodiments, a single display panel may be configured to be a flat display type or a bent display type. For example, utilizing a single receptacle connector with the single display panel may permit the single display panel to be configured to be a flat display type or a bent display type. For instance, the single receptacle connector may receive a first plug connector in a first direction and may receive a second plug connector in a second direction, different from the first direction.

In one or more embodiments, the single receptacle connector may be or include an embedded display port (eDP) socket. For example, the single receptacle connector may accept an eDP cable from two different directions. In one instance, the single receptacle connector may accept an eDP cable when a flat panel display is configured in bent display panel configuration. In another instance, the single receptacle connector may accept an eDP cable when a flat panel display is configured in flat display panel configuration.

Figure 1B:
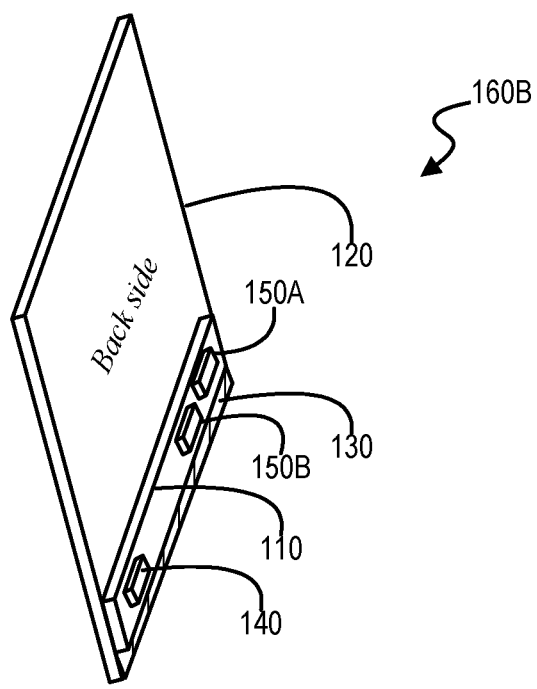

Turning now to FIGS. 1A and 1B, an example of a printed circuit board coupled to a display is illustrated, according to one or more embodiments. As shown, a printed circuit board (PCB) 110 may be coupled to a display 120 via a flexible PCB 130. In one or more embodiments, display 120 may be or include a liquid crystal display (LCD). For example, display 120 may include a light source behind the LCD. For instance, the light source may include one or more light emitting diodes (LEDs). In one or more embodiments, display 120 may be or include multiple LEDs. In one or more embodiments, LEDs may be or include organic LEDs (OLEDs). In one example, OLEDs may be driven with a passive matrix (PMOLED). For instance, each row and line in display 120 may be controlled sequentially, such as one by one. In another example, OLEDs may be driven with an active matrix (AMOLED). For instance, controlling OLEDs with AMOLED may include utilizing a transistor backplane that may access and/or may switch each individual pixel on or off, which may permit and/or allow for higher resolution and/or varying display sizes. In one or more embodiments, a pixel of a display may include three LEDs. For example, a pixel of display 120 may include a first LED that emits light in a "red" portion of a visual spectrum, a second LED that emits light in a "green" portion of the visual spectrum, and a third LED that emits light in a "blue" portion of the visual spectrum.

As illustrated, a receptacle connector 140 may be mounted on PCB 110. In one or more embodiments, receptacle connector 140 may be soldered to PCB 110. As shown, components 150A and 150B may be mounted on PCB 110. In one or more embodiments, components 150A and 150B may be soldered to PCB 110. In one or more embodiments, receptacle connector 140 may be communicatively coupled to one or more of components 150A and 150B. For example, a component 150 may be or include an integrated circuit. In one or more embodiments, component 150A may be communicatively coupled to component 150B. In one or more embodiments, PCB 110 may be communicatively coupled to at least one processor of an information handling system. In one or more embodiments, the at least one processor of the information handling system may be communicatively coupled to display 120 via one or more of receptacle connector 140 and components 150A and 150B, among others. For example, receptacle connector 140 may receive video information from the at least one processor of the information handling system. In one instance, PCB 110 may receive the video information via receptacle connector 140 and may provide the video information to one or more of components 150A and 150B. In another instance, the one or more of components 150A and 150B may provide the video information to display 120. In one or more embodiments, the one or more of components 150A and 150B may provide the video information to display 120 via flexible PCB 130. For example, PCB 110 may provide the video information to display 120 via flexible PCB 130.

As shown in FIG. 1A, receptacle connector 140 may be accessed via a front side of display 120. For example, display 120 may be in a bent configuration. In one or more embodiments, display 120 may be at a range of angles θ with respect PCB 110. As illustrated in FIG. 1B, receptacle connector 140 may accessed via a back side of display 120. For example, display 120 may be in a flat configuration. In one or more embodiments, flexible PCB 130 may perform like or as a hinge. For example, flexible PCB 130 may permit a bent configuration and a flat configuration of display 120. In one or more embodiments, a display panel system 160 may include PCB 110, display 120, and flexible PCB 130, among others. In one example, flexible PCB 130 may permit a bent configuration of display panel system 160A. In another example, flexible PCB 130 may permit a flat configuration of display panel system 160B. In one or more embodiments, display panel system 160A may become display panel system 160B by rotating PCB 110 to a back side of display 120. For example, a manufacturing process may rotate PCB 110 to the back side of display 120. For instance, manufacturing equipment may rotate PCB 110 to the back side of display 120. In one or more embodiments, a first cable assembly may be utilized with display panel system 160A. In one or more embodiments, a second cable assembly may be utilized with display panel system 160B. For example, the second cable assembly may be different from the first cable assembly. In one or more embodiments, the first cable assembly and the second cable assembly may include the same receptacle connector plug connector.

Figure 2A:
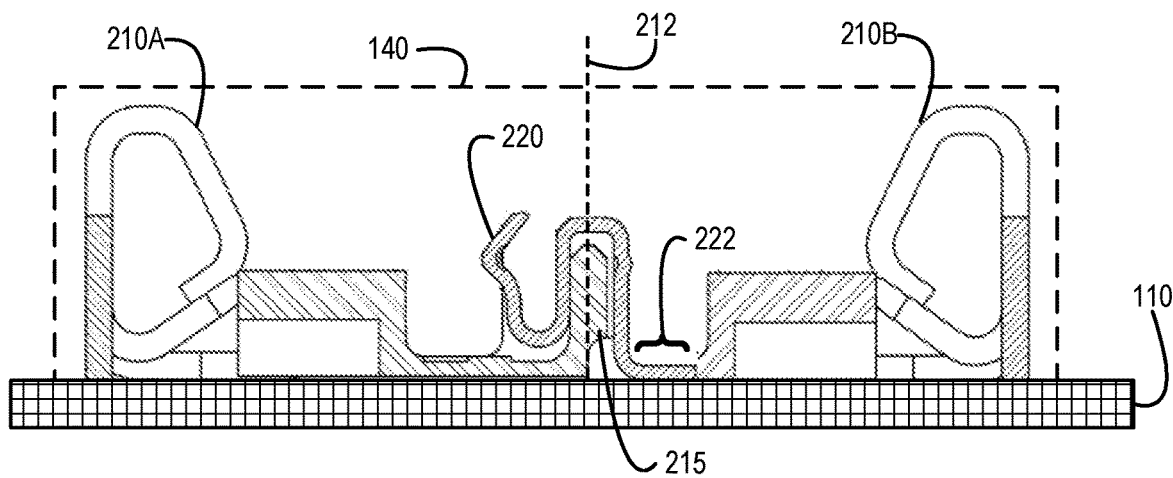
FIG. 2A illustrates an example cross section of a receptacle connector, according to one or more embodiments.

Turning now to FIG. 2A, an example cross section of a receptacle connector is illustrated, according to one or more embodiments. As shown, receptacle connector 140 may include springs 210A and 210B. For example, springs 210A and 210B may clasp a plug connector. For instance, a spring 210 may be or include a spring latch. In one or more embodiments, a spring 210 may be configured to be soldered to PCB 110. In one or more embodiments, a spring 210 may be configured to be grounded. For example, a spring 210 may be configured to be coupled to a ground of PCB 110 (e.g., a ground conductor of PCB 110). For instance, a spring 210 may be or include a grounding spring. In one or more embodiments, a spring 210 may include a P-section. For example, the P-section of spring 210 may clasp and/or hold a plug connector to receptacle connector 140. For instance, the P-section of spring 210 may be a backwards P-section, as shown by spring 210B. In one or more embodiments, a spring 210 may include any suitable geometric shape and/or configuration to clasp and/or hold a plug connector to receptacle connector 140.

As illustrated, receptacle connector 140 may include a terminal 215. For example, terminal 215 may include conductors 220. In one or more embodiments, conductors 220 may be disposed on terminal 215. For example, conductors 220 may be disposed on terminal 215 in a side-by-side spaced apart relationship, as illustrated in FIG. 2G. For instance, conductors 220 may be spaced apart by a distance 217. In one or more embodiments, conductors 220 may include respective sections 222 that are configured to be mounted on a PCB. For example, mounting conductors 220 on the PCB may include soldering conductors 220 to the PCB. For instance, conductors 220 may include respective sections 222 that are configured to be soldered conductors and/or pads of PCB 110. In one or more embodiments, mounting receptacle connector 140 to PCB 110 may include soldering, to PCB 110, the respective sections 222 of conductors 220 that are configured to be soldered to PCB 110.

In one or more embodiments, a conductor 220 may include a spring mechanism. In one example, a conductor 220 may include a S-shaped section. For instance, a conductor 220 may include a S-shaped section to give conductor 220 a spring property in a direction orthogonal to a longitudinal axis 212 of receptacle connector 140. In another example, a conductor 220 may include a U-shaped section. For instance, a conductor 220 may include a U-shaped section to give conductor 220 a spring property in a direction orthogonal to longitudinal axis 212. In one or more embodiments, conductors 220 may be or include electrical contacts. In one or more embodiments, a conductor 220 may include an angled section. For example, the angled section of conductor 220 may contact a conductor of a plug connector. In one or more embodiments, the angled section of conductor 220 may include an angle greater than or equal to forty-five degrees to one hundred and thirty-five degrees. In one or more embodiments, the angled section of conductor 220 may include an angle less than or equal to one hundred and thirty-five degrees. In one or more embodiments, the angled section of conductor 220 may include an angle from forty-five degrees to one hundred and thirty-five degrees.

In one or more embodiments, the angled section of conductor 220 may include an angle that permits conductor 220 may contact a conductor of a plug connector. In one or more embodiments, a conductor 220 may include a U-shaped section. For example, the U-shaped section of conductor 220 may contact a conductor of a plug connector. In one or more embodiments, a conductor 220 may include multiple U-shaped sections. In one example, a conductor 220 may include a first U-shaped section to give conductor 220 a spring property in a direction orthogonal to longitudinal axis 212. In another example, a conductor 220 may include a second U-shaped section, different from the first U-shaped section, that may contact a conductor of a plug connector.

Figure 2B:
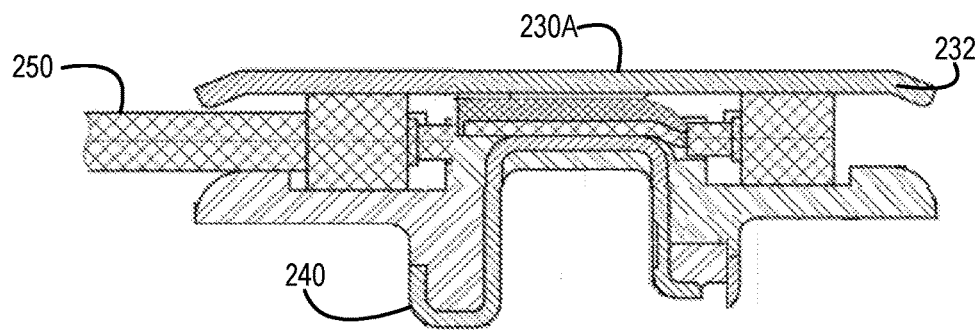
FIG. 2B illustrates an example cross section of a plug connector, according to one or more embodiments.

Turning now to FIG. 2B, an example cross section of a plug connector is illustrated, according to one or more embodiments. As shown, a plug connector 230A may include multiple conductors 240. In one or more embodiments, plug connector 230A may be mated with receptacle connector 140. For example, multiple conductors 240 may be coupled to respective multiple conductors 220 when plug connector 230A is mated with receptacle connector 140. As illustrated, plug connector 230A may include an insulating housing 232. As shown, plug connector 30A may be coupled to a cable 250. In one or more embodiments, cable 250 may include multiple conductors. For example, the multiple conductors of cable 250 may be respectively coupled to multiple conductors 240. In one instance, multiple spring mechanisms of respective multiple conductors 220 may fasten multiple conductors 220 to respective multiple conductors 240. In another instance, multiple spring mechanisms of respective multiple conductors 220 may couple multiple conductors 220 to respective multiple conductors 240 such that multiple conductors 220 are electrically coupled to respective multiple conductors 240. In one or more embodiments, conductors 240 may be or include electrical contacts.

Figure 2C:
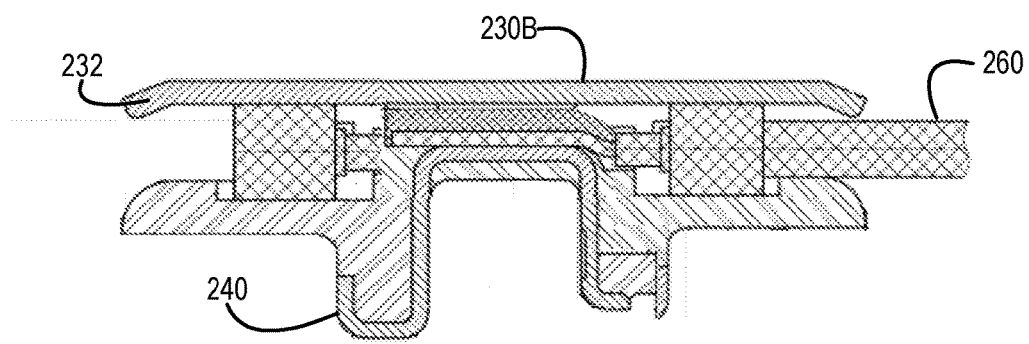
FIG. 2C illustrates another example cross section of a plug connector, according to one or more embodiments.

Turning now to FIG. 2C, another example cross section of a plug connector is illustrated, according to one or more embodiments. As shown, a plug connector 230B may include multiple conductors 240. In one or more embodiments, plug connector 230B may be mated with receptacle connector 140. For example, multiple conductors 240 may be coupled to respective multiple conductors 220 when plug connector 230B is mated with receptacle connector 140. As illustrated, plug connector 230B may include an insulating housing 232. As shown, plug connector 230B may be coupled to a cable 260. In one or more embodiments, cable 260 may include multiple conductors. For example, the multiple conductors of cable 260 may be respectively coupled to multiple conductors 240. In one or more embodiments, a plug connector 230 may be or include a VESA (Video Electronics Standards Association) plug connector. In one or more embodiments, a receptacle connector 140 may be or include a VESA receptacle connector.

Figure 2D:
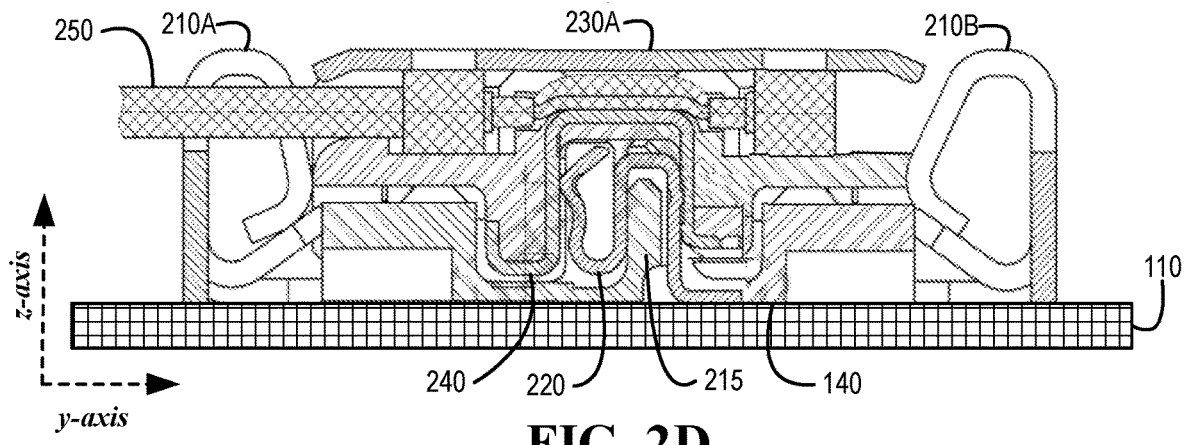
FIG. 2D illustrates an example cross section of a plug connector mated with a receptacle connector, according to one or more embodiments.

Turning now to FIG. 2D, an example cross section of a plug connector mated with a receptacle connector is illustrated, according to one or more embodiments. As shown, plug connector 230A may be mated with receptacle connector 140. As illustrated, conductors 240 may be coupled to conductors 220.

Figure 2E:
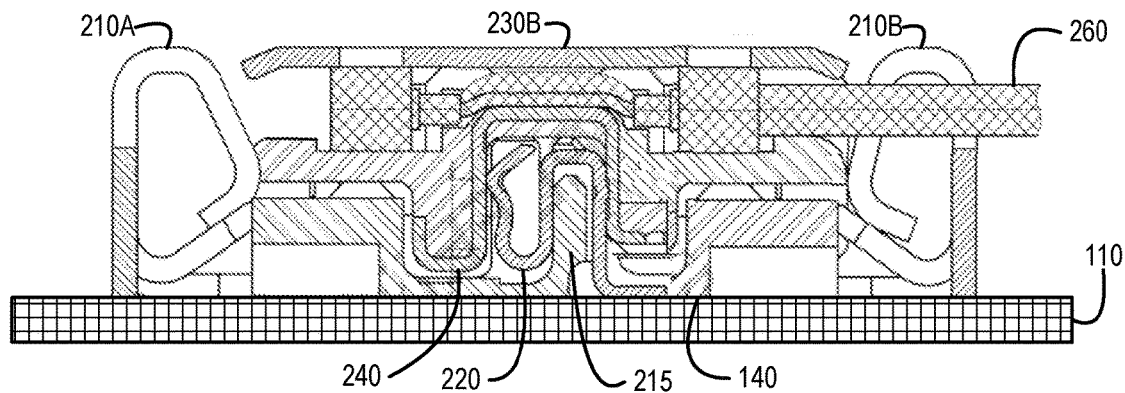
FIGS. 2E and 2F illustrate another example cross section of a plug connector mated with a receptacle connector, according to one or more embodiments.
Figure 2F:
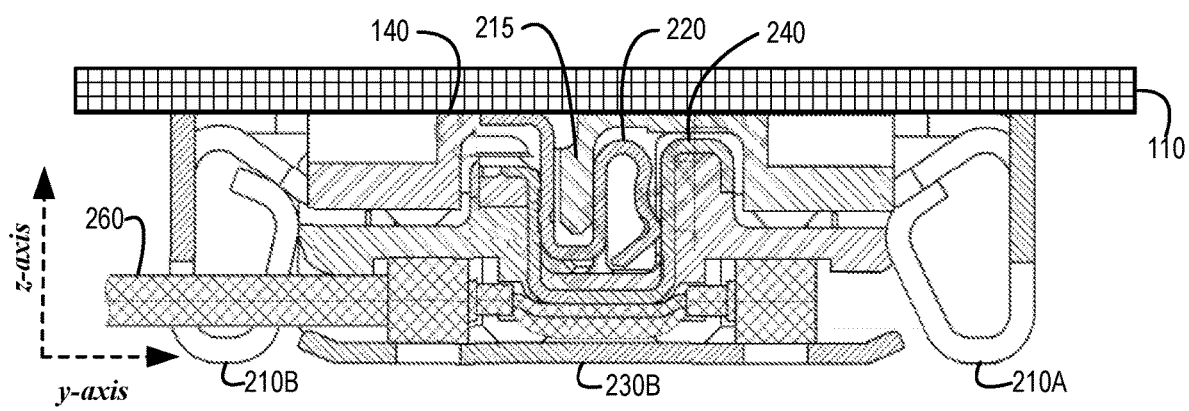
Figure 2G:
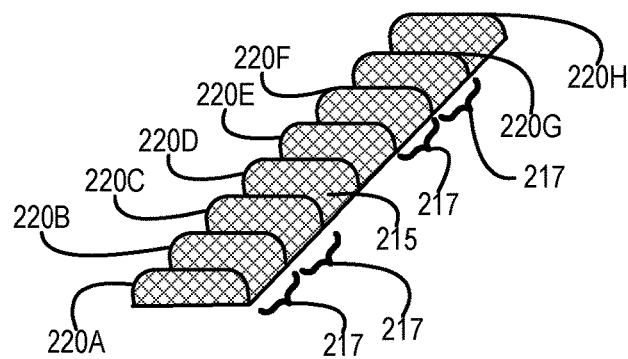
FIG. 2G illustrates an example of conductors disposed on a terminal in side-by-side spaced apart relationship, according to one or more embodiments.

Turning now to FIGS. 2E and 2F, another example cross section of a plug connector mated with a receptacle connector is illustrated, according to one or more embodiments. As shown, plug connector 230B may be mated with receptacle connector 140. As illustrated, conductors 240 may be coupled to conductors 220.

As illustrated in FIG. 2F, receptacle connector 140 may be utilized in a flat panel display configuration (e.g., a non-bent configuration). For example, plug connector 230B and cable 260 may be mated with receptacle connector 140 from the left of FIG. 2F. For instance, plug connector 230A and cable 250 may be mated with receptacle connector 140 from the left of FIG. 2D. In one or more embodiments, receptacle connector 140 may permit and/or allow a single assembly movement (e.g., via a positive y-axis vector). In one example, plug connector 230A and cable 250 may be mated with receptacle connector 140 from the left of FIG. 2D, utilizing the single assembly movement (e.g., via the positive y-axis vector) and moving plug connector 230A down (e.g., via a negative z-axis vector). In another example, plug connector 230B and cable 260 may be mated with receptacle connector 140 from the left of FIG. 2F, utilizing the single assembly movement (e.g., via the positive y-axis vector) and moving plug connector 230B up (e.g., via a positive z-axis vector). In one or more embodiments, receptacle connector 140 may not include a key notch. For example, without a key notch, plug connector 230 may be mated with receptacle connector 140 as illustrated in FIGS. 2D-2F. In one or more embodiments, plug connector 230 may not include a key notch. For example, without a key notch, plug connector 230 may be mated with receptacle connector 140 as illustrated in FIGS. 2D-2F.

In one or more embodiments, utilizing receptacle connector 140 and the single assembly movement (e.g., via the positive y-axis vector) may permit and/or allow a manufacturing line to produce display system 160A and display system 160B. In one example, utilizing receptacle connector 140 and the single assembly movement (e.g., via the positive y-axis vector) may eliminate a retooling step and/or process when switching from producing display system 160A to producing display system 160B. In another example, utilizing receptacle connector 140 and the single assembly movement (e.g., via the positive y-axis vector) may eliminate a retooling step and/or process when switching from producing display system 160B to producing display system 160A. In one or more embodiments, eliminating a retooling step and/or process may improve productivity, speed, and/or efficiency of a manufacturing line. For example, eliminating a retooling step and/or process may permit and/or allow the manufacturing line to produce additional display systems 160 by utilizing an amount of time that would be utilized in the retooling step and/or process.

In one or more embodiments, receptacle connector 140 may mate with plug connector 230 that is not rotated or is rotated by one hundred and eighty degrees. In one example, receptacle connector 140 may mate with plug connector 230A that is not rotated, as illustrated in FIG. 2D. In another example, receptacle connector 140 may mate with plug connector 230B that is rotated by one hundred and eighty degrees, as illustrated in FIGS. 2E and 2F. In one or more embodiments, receptacle connector 140 may mate with plug connector 230 in a first position and may mate with plug connector 230 in a second position, rotated one hundred and eighty degrees from the first position. In one example, receptacle connector 140 may mate with plug connector 230 in the first position, as illustrated in FIG. 2D. In another example, receptacle connector 140 may mate with plug connector 230 in the second position, rotated one hundred and eighty degrees from the first position, as illustrated in FIGS. 2E and 2F.

Figure 3A:
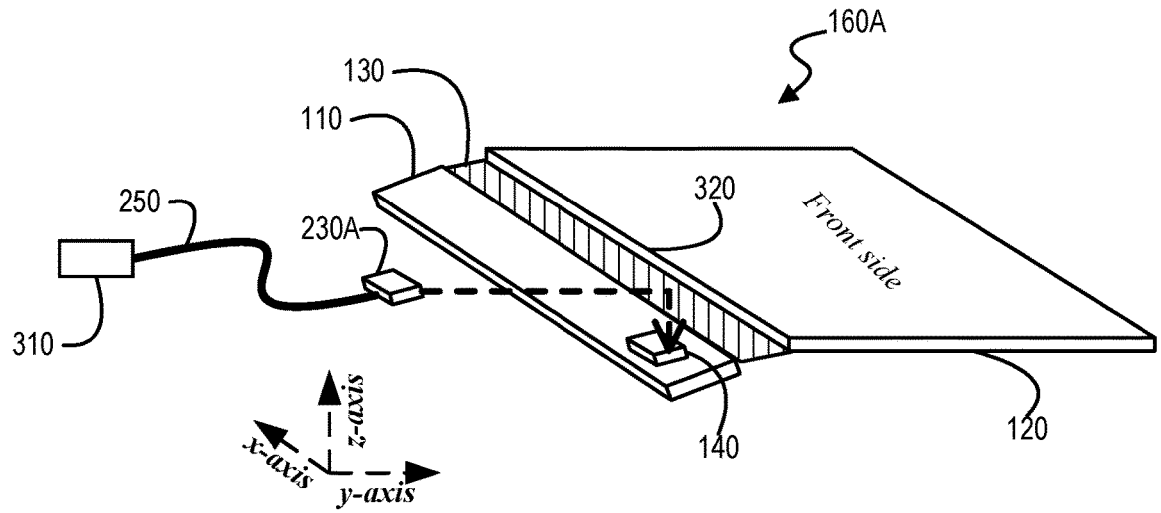
FIG. 3A illustrates an example of mating a plug connector with a receptacle connector, according to one or more embodiments.

Turning now to FIG. 3A, an example of mating a plug connector with a receptacle connector is illustrated, according to one or more embodiments. As shown, plug connector 230A may be mated to receptacle connector 140 in a manner approximate to the dashed arrow. For example, plug connector 230A may be mated to receptacle connector 140 towards a side 320 of display 120. As illustrated, cable 250 may be coupled to plug connector 230A. For example, conductors of cable 250 may be coupled to conductors 240 of plug connector 230A. As shown, cable 250 may be coupled to a connector 310. In one example, connector 310 may be or include a plug connector. In another example, connector 310 may be or include a receptacle connector. In one or more embodiments, connector 310 may be coupled to an information handling system.

Figure 3B:
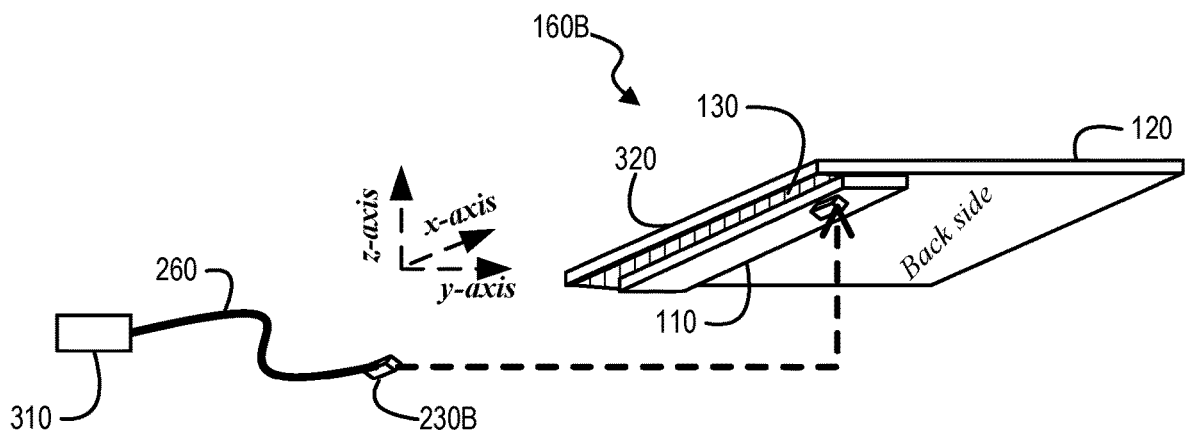
FIG. 3B illustrates a second example of mating a plug connector with a receptacle connector, according to one or more embodiments.

Turning now to FIG. 3B, a second example of mating a plug connector with a receptacle connector is illustrated, according to one or more embodiments. As shown, plug connector 230B may be mated to receptacle connector 140 in a manner approximate to the dashed arrow. For example, plug connector 230B may be mated to receptacle connector 140 towards side 320 of display 120. As illustrated, cable 260 may be coupled to plug connector 230B. For example, conductors of cable 260 may be coupled to conductors 240 of plug connector 230B. In one or more embodiments, the conductors of cable 260 may be coupled to conductors 240 of plug connector 230B in a different manner than that of the conductors of cable 250 coupled to conductors 240 of plug connector 230A. For example, the conductors of cable 260 may be coupled to conductors 240 of plug connector 230B in a different arrangement than that of the conductors of cable 250 coupled to conductors 240 of plug connector 230A. As shown, cable 260 may be coupled to connector 310. In one example, connector 310 may be or include a plug connector. In another example, connector 310 may be or include a receptacle connector. In one or more embodiments, connector 310 may be coupled to an information handling system.

Figure 3C:
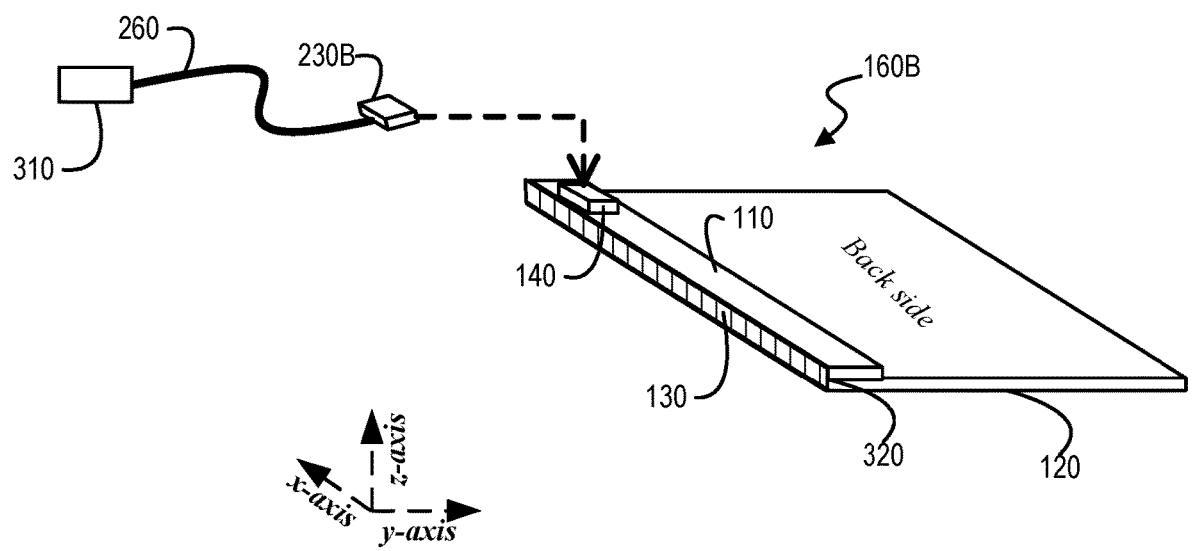
FIG. 3C illustrates another example of mating a plug connector with a receptacle connector, according to one or more embodiments.

Turning now to FIG. 3C, another example of mating a plug connector with a receptacle connector is illustrated, according to one or more embodiments. As shown, plug connector 230B may be mated to receptacle connector 140 in a manner approximate to the dashed arrow. For example, plug connector 230B may be mated to receptacle connector 140 towards side 320 of display 120. In one or more embodiments, plug connector 230B may be mated to receptacle connector 140 in same or similar directions as plug connector 230A may be mated to receptacle connector 140. For example, plug connector 230A may be mated to receptacle connector 140 via towards and downwards movements, as illustrated in FIG. 3A, and plug connector 230B may be mated to receptacle connector 140 via towards and downwards movements, as shown in FIG. 3C.

Figure 3D:
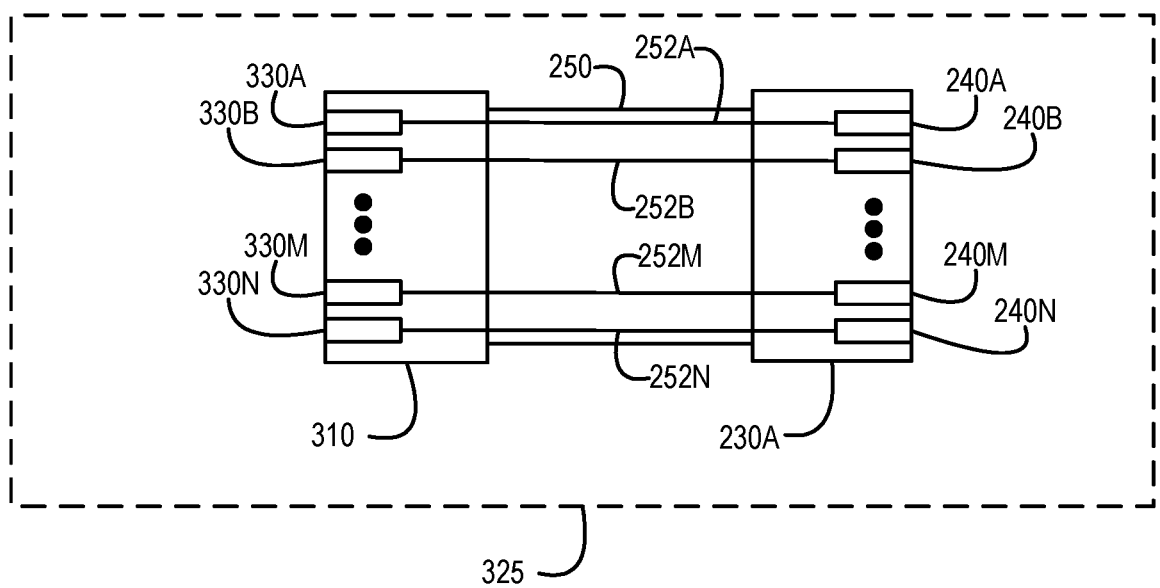
FIG. 3D illustrates an example of a cable assembly, according to one or more embodiments.

Turning now to FIG. 3D, an example of a cable assembly is illustrated, according to one or more embodiments. As shown, a cable assembly 325 may include plug connector 230A. As illustrated, cable assembly 325 may include cable 250. As shown, cable assembly 325 may include connector 310. In one example, connector 310 may be or include a plug connector. In another example, connector 310 may be or include a receptacle connector. In one or more embodiments, connector 310 may be coupled to an information handling system. As illustrated, connector 310 may include conductors 330A-330N. As shown, cable 250 may include conductors 252A-252N. As illustrated, conductors 252A-252N may couple conductors 330A-330N to conductors 240A-240N, respectively. In one or more embodiments, cable 250 may include one or more twisted pairs of conductors 252A-252N. In one or more embodiments, conductors 252A-252N may be parallel to each other. For example, cable 250 may be or include a ribbon cable. In one or more embodiments, cable 250 may be or include one or more transmission lines.

Figure 3E:
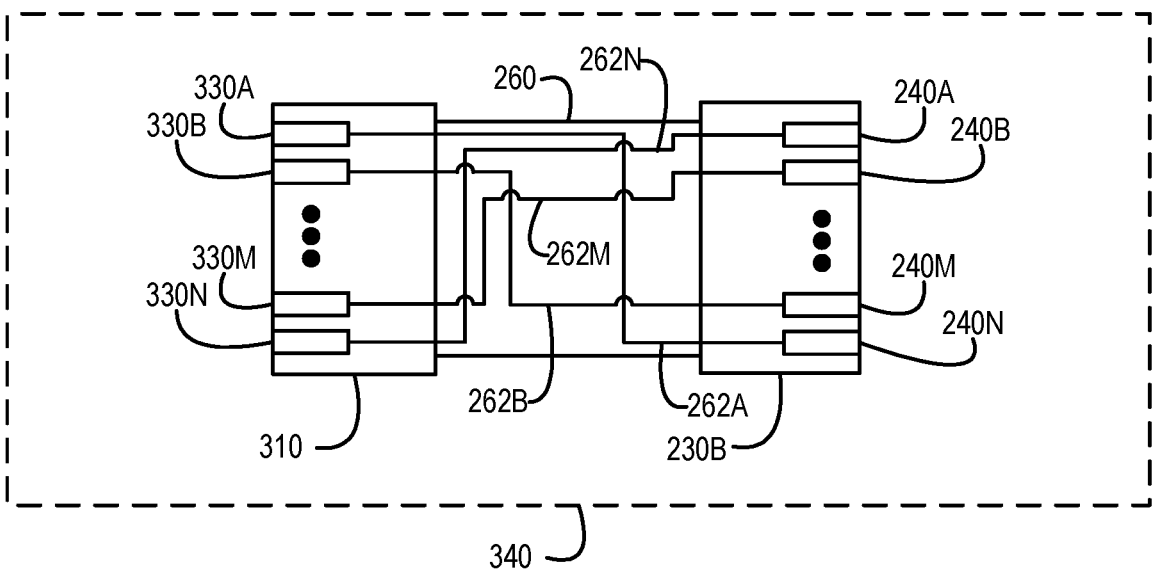
FIG. 3E illustrates another example of a cable assembly, according to one or more embodiments.

Turning now to FIG. 3E, another example of a cable assembly is illustrated, according to one or more embodiments. As shown, a cable assembly 340 may include plug connector 230B. As illustrated, cable assembly 340 may include cable 260. As shown, cable assembly 340 may include connector 310. In one example, connector 310 may be or include a plug connector. In another example, connector 310 may be or include a receptacle connector. In one or more embodiments, connector 310 may be coupled to an information handling system. As illustrated, connector 310 may include conductors 330A-330N. As shown, cable 260 may include conductors 262A-262N. As illustrated, conductors 262A-262N may couple conductors 330A-330N to conductors 240N-240A, respectively. In one or more embodiments, cable 260 may include one or more twisted pairs of conductors 262A-262N. In one or more embodiments, conductors 262A-262N may be parallel to each other. For example, cable 260 may be or include a ribbon cable. In one or more embodiments, cable 260 may be or include one or more transmission lines.

In one or more embodiments, display panel system 160A may utilize cable assembly 325. In one or more embodiments, display panel system 160B may utilize cable assembly 340. In one or more embodiments, utilizing cable assembly 325 with display panel system 160A and utilizing cable assembly 340 with display panel system 160B may permit and/or allow coupling connector 310 to an information handling system regardless of a flat configuration or a bent configuration of a display panel system. For example, utilizing cable assembly 325 with display panel system 160A and utilizing cable assembly 340 with display panel system 160B may permit and/or allow coupling of connector 310 to an information handling system without retooling and/or reconfiguring of a manufacturing line.

Figure 4A:
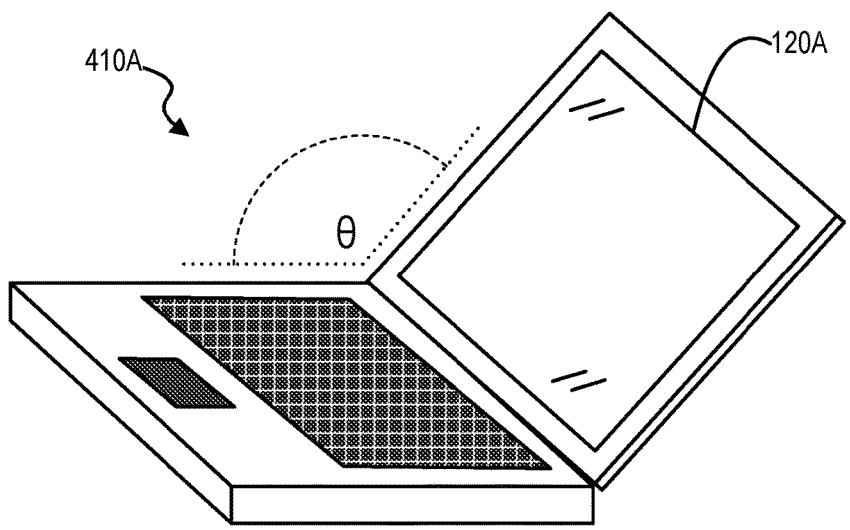
FIGS. 4A-4C illustrate examples of information handling systems, according to one or more embodiments.
Figure 4B:
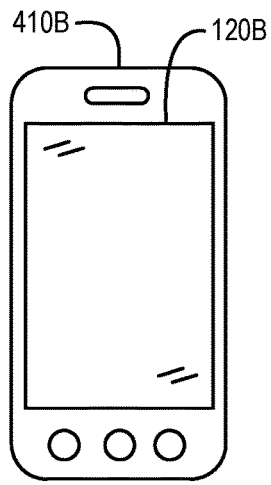
Figure 4C:
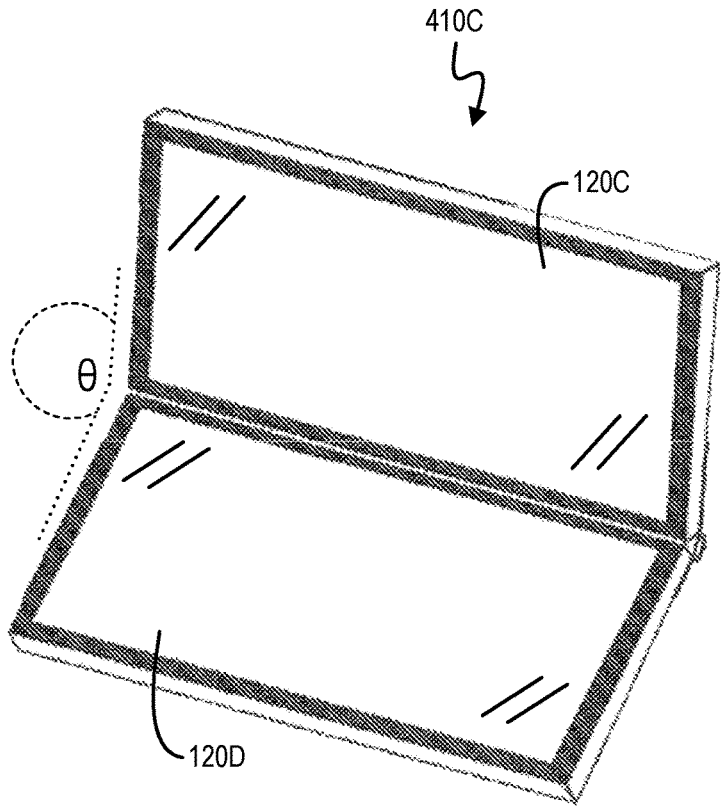

Turning now to FIGS. 4A-4C, examples of information handling systems are illustrated, according to one or more embodiments. As shown in FIG. 4A, an information handling system (IHS) 410A may include a form factor of a laptop computer system. In one or more embodiments, IHS 410A may include display panel system 160A. As illustrated, display 120A may be at an angle $\theta$ from a housing of IHS 410A. In one or more embodiments, display 120A may be at a range of angles $\theta$ with respect a housing of IHS 410A. As shown in FIG. 4B, an IHS 410B may include a form factor of a tablet computing device, a telephone computing device, a personal digital assistant computing device, and/or a digital music player computing device, among others. In one or more embodiments, IHS 410B may include display panel system 160B. As illustrated in FIG. 4C, an IHS 410C may include a form factor of a tablet computing device, a telephone computing device, a personal digital assistant computing device, a laptop computing device, and/or a digital music player computing device, among others. As shown, IHS 410C may include multiple displays 120C and 120D. In one or more embodiments, IHS 410C may include display panel system 160A and display panel system 160B. In one example, display panel system 160A may be utilized with display 120C. In another example, display panel system 160B may be utilized with display 120D. As illustrated, display 120C may be at an angle $\theta$ from display 120D. In one or more embodiments, display 120C may be at a range angles $\theta$ with respect to display 120D.

Figure 4D:
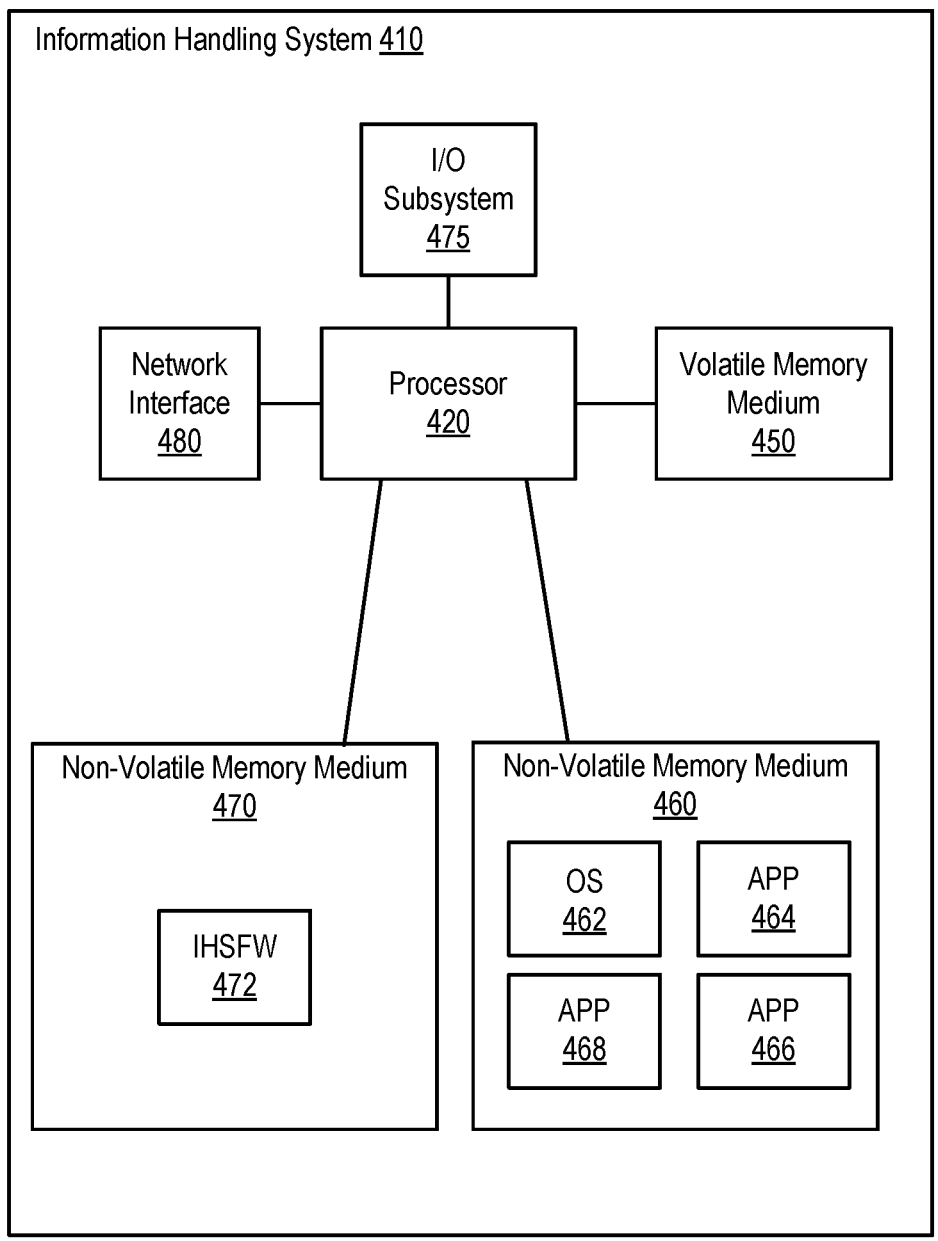
FIG. 4D illustrates another example of an information handling system, according to one or more embodiments.

Turning now to FIG. 4D, another example of an information handling system is illustrated, according to one or more embodiments. An IHS 410 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 410 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 410 may include or have a form factor of that of or similar to one or more of a laptop, a notebook, a telephone, a tablet, and a PDA, among others. For example, a portable IHS 410 may be readily carried and/or transported by a user (e.g., a person). In one or more embodiments, components of IHS 410 may include one or more storage devices, one or more communications ports for communicating with external devices as well as various input and output (I/O) devices, such as a keyboard, a mouse, and a video display (e.g., display 120), among others. In one or more embodiments, IHS 410 may include one or more buses operable to transmit communication between or among two or more hardware components. In one example, a bus of IHS 410 may include one or more of a memory bus, a peripheral bus, and a local bus, among others. In another example, a bus of IHS 410 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I²C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 410 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 410 may include a processor 420, a volatile memory medium 450, non-volatile memory media 460 and 470, an I/O subsystem 475, and a network interface 480. As illustrated, volatile memory medium 450, non-volatile memory media 460 and 470, I/O subsystem 475, and network interface 480 may be communicatively coupled to processor 420.

In one or more embodiments, one or more of volatile memory medium 450, non-volatile memory media 460 and 470, I/O subsystem 475, and network interface 480 may be communicatively coupled to processor 420 via one or more buses, one or more switches, and/or one or more root complexes, among others. In one example, one or more of volatile memory medium 450, non-volatile memory media 460 and 470, I/O subsystem 475, and network interface 480 may be communicatively coupled to processor 420 via one or more PCI-Express (PCIe) root complexes. In another example, one or more of an I/O subsystem 475 and a network interface 480 may be communicatively coupled to processor 420 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 450 may include volatile storage such as, for example, RAM, DRAM (dynamic RAM), EDO RAM (extended data out RAM), SRAM (static RAM), etc. One or more of non-volatile memory media 460 and 470 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 480 may be utilized in communicating with one or more networks and/or one or more other information handling systems. In one example, network interface 480 may enable IHS 410 to communicate via a network utilizing a suitable transmission protocol and/or standard. In a second example, network interface 480 may be coupled to a wired network. In a third example, network interface 480 may be coupled to an optical network. In another example, network interface 480 may be coupled to a wireless network.

In one or more embodiments, network interface 480 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 420 may execute processor instructions in implementing one or more systems, one or more flowcharts, one or more methods, and/or one or more processes described herein. In one example, processor 420 may execute processor instructions from one or more of memory media 450-470 in implementing one or more systems, one or more flowcharts, one or more methods, and/or one or more processes described herein. In another example, processor 420 may execute processor instructions via network interface 480 in implementing one or more systems, one or more flowcharts, one or more methods, and/or one or more processes described herein.

In one or more embodiments, processor 420 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 420 may interpret and/or execute program instructions and/or process data stored locally (e.g., via memory media 450-470 and/or another component of IHS 410). In another example, processor 420 may interpret and/or execute program instructions and/or process data stored remotely (e.g., via a network storage resource).

In one or more embodiments, I/O subsystem 475 may represent a variety of communication interfaces, graphics interfaces, video interfaces, user input interfaces, and/or peripheral interfaces, among others. For example, I/O subsystem 475 may include one or more of a touch panel and a display adapter, among others. For instance, a touch panel may include circuitry that enables touch functionality in conjunction with a display that is driven by a display adapter.

As shown, non-volatile memory medium 460 may include an operating system (OS) 462, and applications (APPs) 464-468. In one or more embodiments, one or more of OS 462 and APPs 464-468 may include processor instructions executable by processor 420. In one example, processor 420 may execute processor instructions of one or more of OS 462 and APPs 464-468 via non-volatile memory medium 460. In another example, one or more portions of the processor instructions of the one or more of OS 462 and APPs 464-468 may be transferred to volatile memory medium 450, and processor 420 may execute the one or more portions of the processor instructions of the one or more of OS 462 and APPs 464-468 via volatile memory medium 450.

As illustrated, non-volatile memory medium 470 may include information handling system firmware (IHSFW) 472. In one or more embodiments, IHSFW 472 may include processor instructions executable by processor 420. For example, IHSFW 472 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 420 may execute processor instructions of IHSFW 472 via non-volatile memory medium 470. In another instance, one or more portions of the processor instructions of IHSFW 472 may be transferred to volatile memory medium 450, and processor 420 may execute the one or more portions of the processor instructions of IHSFW 472 via volatile memory medium 450.

In one or more embodiments, processor 420 and one or more components of IHS 410 may be included in a system-on-chip (SoC). For example, the SoC may include processor 420 and a platform controller hub (not specifically illustrated). Although not specifically shown, IHS 410 may include one or more printed circuit boards (PCBs) 110, according to one or more embodiments. For example, IHS 410 may include one or more display panel systems 160, among others. In one instance, IHS 410 may include display panel system 160A. In a second instance, IHS 410 may include display panel system 160B. In another instance, IHS 410 may include display panel system 160A and display panel system 160B. Although not specifically illustrated, IHS 410 may include one or more connector receptacle connectors 140, according to one or more embodiments. For example, IHS 410 may include one or more display panel systems 160, among others. In one instance, IHS 410 may include display panel system 160A. In a second instance, IHS 410 may include display panel system 160B. In another instance, IHS 410 may include display panel system 160A and display panel system 160B. Although not specifically shown, IHS 410 may include one or more cable assemblies, according to one or more embodiments. For example, IHS 410 may include one or more of cable assembly 325 and cable assembly 340, among others. In one instance, IHS 410 may include cable assembly 325 (e.g., for utilization with display panel system 160A). In a second instance, IHS 410 may include cable assembly 340 (e.g., for utilization with display panel system 160B). In another instance, IHS 410 may include cable assembly 325 (e.g., for utilization with display panel system 160A) and cable assembly 340 (e.g., for utilization with display panel system 160B).

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, one or more systems, one or more methods, and/or one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A receptacle connector, comprising:
    a plurality of springs that are configured to hold a plug connector to the receptacle connector when the plug connector is mated with the receptacle connector;
    a terminal; and
    a plurality of conductors disposed on the terminal in parallel side-by-side spaced apart relationship, each conductor of the plurality of conductors disposed on the terminal includes a first U-shaped section to give the conductor a spring property in a direction orthogonal to a longitudinal axis of the receptacle connector to contact a respective conductor of a plurality of conductors of the plug connector and includes a section that is configured to be soldered to a printed circuit board;
    wherein the receptacle connector is configured to mate with the plug connector in a first position and a second position rotated one hundred and eighty degrees from the first position.

2. The receptacle connector of claim 1, wherein the plurality of springs are configured to be coupled to a ground conductor of the printed circuit board.

3. The receptacle connector of claim 1, wherein each conductor of the plurality of conductors disposed on the terminal includes a second U-shaped section, different from the first U-shaped section, to give the conductor the spring property in the direction orthogonal to the longitudinal axis of the receptacle connector to contact the respective conductor of the plurality of conductors of the plug connector.

4. The receptacle connector of claim 1, wherein each conductor of the plurality of conductors includes an angled section, different from the first U-shaped section to give the conductor the spring property, that permits the conductor to contact the respective conductor of the plurality of conductors of the plug connector.

5. The receptacle connector of claim 4, wherein the angled section includes an angle greater than or equal to forty-five degrees to one hundred and thirty-five degrees.

6. The receptacle connector of claim 4, wherein the angled section includes an angle less than or equal to one hundred and thirty-five degrees.

7. The receptacle connector of claim 1, wherein each spring of the plurality of springs includes a P-section to hold the plug connector to the receptacle connector.

8. The receptacle connector of claim 1, wherein the plurality of springs are disposed on either side of the plurality of conductors disposed on the terminal.

9. A printed circuit board,
wherein the printed circuit board has a receptacle connector mounted to the printed circuit board;
wherein the receptacle connector includes:
a plurality of springs that are configured to hold a plug connector to the receptacle connector when the plug connector is mated with the receptacle connector;
a terminal; and
a plurality of conductors disposed on the terminal in parallel side-by-side spaced apart relationship, each conductor of the plurality of conductors disposed on the terminal includes a first U-shaped section to give the conductor a spring property in a direction orthogonal to a longitudinal axis of the receptacle connector to contact a respective conductor of a plurality of conductors of the plug connector and includes a section that is configured to be soldered to a printed circuit board;
wherein the receptacle connector is configured to mate with the plug connector in a first position and a second position rotated one hundred and eighty degrees from the first position; and
wherein the printed circuit board has at least one integrated circuit mounted to the printed circuit board; and
wherein the printed circuit board is configured to be coupled to a display and configured to:
receive video information via the receptacle connector; and
provide the video information to the at least one integrated circuit.

10. The printed circuit board of claim 9, wherein the plurality of springs are configured to be coupled to a ground conductor of the printed circuit board.

11. The printed circuit board of claim 9, wherein each conductor of the plurality of conductors disposed on the terminal includes a second U-shaped section, different from the first U-shaped section, to give the conductor the spring property in the direction orthogonal to the longitudinal axis of the receptacle connector to contact the respective conductor of the plurality of conductors of the plug connector.

12. The printed circuit board of claim 9, wherein each conductor of the plurality of conductors includes an angled section, different from the first U-shaped section to give the conductor the spring property, that permits the conductor to contact the respective conductor of the plurality of conductors of the plug connector.

13. The printed circuit board of claim 12, wherein the angled section includes an angle greater than or equal to forty-five degrees to one hundred and thirty-five degrees.

14. The printed circuit board of claim 12, wherein the angled section includes an angle less than or equal to one hundred and thirty-five degrees.

15. The printed circuit board of claim 9, wherein each spring of the plurality of springs includes a P-section to hold the plug connector to the receptacle connector.

16. The printed circuit board of claim 9, wherein the plurality of springs are disposed on either side of the plurality of conductors disposed on the terminal.

17. An information handling system, comprising:
a first display;
at least one processor;
a memory medium, coupled to the at least one processor, configured to store instructions executable by the at least one processor; and
a first printed circuit board coupled to the at least one processor and coupled to the first display;
wherein the first printed circuit board has a first receptacle connector mounted to the first printed circuit board;
wherein the first receptacle connector includes:
a first plurality of springs that are configured to hold a first plug connector to the first receptacle connector when the first plug connector is mated with the first receptacle connector;
a first terminal; and
a first plurality of conductors disposed on the first terminal in parallel side-by-side spaced apart relationship, each conductor of the first plurality of conductors disposed on the first terminal includes a first U-shaped section to give the conductor a spring property in a direction orthogonal to a longitudinal axis of the first receptacle connector to contact a respective conductor of a first plurality of conductors of the first plug connector and includes a first section that is configured to be soldered to the first printed circuit board;
wherein the first receptacle connector is configured to mate with the first plug connector in a first position and a second position rotated one hundred and eighty degrees from the first position;
wherein the first printed circuit board has at least one integrated circuit mounted to the first printed circuit board;
wherein the first printed circuit board is coupled to the first display and is configured to:
receive, from the at least one processor, first video information via the first receptacle connector; and
provide the first video information to the at least one integrated circuit of the first printed circuit board; and
wherein the at least one integrated circuit of the first printed circuit board is configured to provide the first video information to the first display.

18. The information handling system of claim 17, further comprising:
a cable assembly that includes the first plug connector and that is configured to receive the first video information and provide the video information to the first receptacle connector.

19. The information handling system of claim 17, further comprising:
a second display; and
a second printed circuit board coupled to the at least one processor and coupled to the second display;
wherein the second printed circuit board has a second receptacle connector mounted to the second printed circuit board;

wherein the second receptacle connector includes:
  a second plurality of springs that are configured to hold a second plug connector to the second receptacle connector when the second plug connector is mated with the second receptacle connector;
  a second terminal; and
  a second plurality of conductors disposed on the second terminal in parallel side-by-side spaced apart relationship, each conductor of the second plurality of conductors disposed on the second terminal includes a second U-shaped section to give the conductor a spring property in a direction orthogonal to a longitudinal axis of the second receptacle connector to contact a respective conductor of a second plurality of conductors of the second plug connector and includes a second section that is configured to be soldered to the second printed circuit board;
wherein the second receptacle connector is configured to mate with the second plug connector in a third position and a fourth position rotated one hundred and eighty degrees from the third position;
wherein the second printed circuit board has at least one integrated circuit mounted to the second printed circuit board;
wherein the second printed circuit board is coupled to the second display and is configured to:
  receive, from the at least one processor, second video information via the second receptacle connector; and
  provide the second video information to the at least one integrated circuit of the second printed circuit board;
wherein the at least one integrated circuit of the second printed circuit board is configured to provide the second video information to the second display; and
wherein the second display is configured to be at a range of angles with respect to the first display.

20. The information handling system of claim 19, wherein second display is configured to be at a range of angles with respect to the second printed circuit board.

* * * * *